United States Patent
Chapman et al.

(10) Patent No.: US 6,704,332 B2
(45) Date of Patent: Mar. 9, 2004

(54) TUNABLE EXTERNAL CAVITY LASER

(75) Inventors: William B. Chapman, Sunnyvale, CA (US); Alejandro Farinas, Mountain View, CA (US); Carter Hand, Los Altos, CA (US); Hua Li, San Jose, CA (US); Andrew Daiber, Palo Alto, CA (US); Nadim Maluf, Los Altos, CA (US)

(73) Assignee: Intel Corporation, Santa Clara, CA (US)

( * ) Notice: Subject to any disclaimer, the term of this patent is extended or adjusted under 35 U.S.C. 154(b) by 87 days.

(21) Appl. No.: 10/099,730

(22) Filed: Mar. 15, 2002

(65) Prior Publication Data

US 2003/0007523 A1 Jan. 9, 2003

Related U.S. Application Data

(63) Continuation-in-part of application No. 09/900,373, filed on Jul. 6, 2001.

(51) Int. Cl.[7] .................................................. H01S 3/10
(52) U.S. Cl. ........................................................ 372/20
(58) Field of Search ............................. 372/26, 20, 50, 372/6

(56) References Cited

U.S. PATENT DOCUMENTS

| 3,967,211 A | 6/1976 | Itzkan et al. |
| 4,309,671 A | 1/1982 | Malyon |
| 4,410,992 A | 10/1983 | Javan |

(List continued on next page.)

FOREIGN PATENT DOCUMENTS

| EP | 0924628 | 8/1998 |
| WO | WO 98/05105 | 2/1998 |
| WO | WO 98/44424 | 10/1998 |
| WO | WO 00/49689 | 8/2000 |
| WO | WO 01/04999 | 1/2001 |
| WO | WO 02/078137 | 10/2002 |
| WO | WO 03/005500 | 1/2003 |
| WO | WO 03/005501 | 1/2003 |
| WO | WO 03/005512 | 1/2003 |

OTHER PUBLICATIONS

Favre, et al. "External–Cavity Semiconductor Laser With 15 nm Continuous Tuning Range", Electronics Letters, Jun. 19, 1996.

Macleod, H.A. *Thin Film Optical Filters* $2^{nd}$ Edition, McGraw–Hill, 1989, pp. 244–269.

Mellis et al. "Miniature Packaged External–Cavity Semiconductor Laser With 50 Ghz Continuous Electrical Tuning Range" Electronics Letters, Apr. 22, 1988.

(List continued on next page.)

*Primary Examiner*—Paul Ip
*Assistant Examiner*—Hung T Vy
(74) *Attorney, Agent, or Firm*—Blakely, Sokoloff, Taylor & Zafman LLP

(57) ABSTRACT

External cavity lasers apparatus and methods that allow fast tuning, high wavelength stability, low cavity losses, and form factors that are comparable to solid state, fixed wavelength lasers. The apparatus comprise a gain medium emitting a light beam, a tunable wavelength selection element positioned in the light beam and configured feed back light of a selected wavelength to the gain medium, and a microelectromechanical systems (MEMS) actuator element operatively coupled to the tunable wavelength selection element. The MEMS actuator element may be configured to actuate the tunable wavelength selection element according to a first degree of freedom to select the wavelength of the feedback to the gain medium, and to actuate the actuate the tunable wavelength selection element according to a second degree of freedom to provide phase control of the feedback. The MEMS actuator element and tunable wavelength selection element may additionally be configured such that actuation of the tunable wavelength selection element with respect to a third degree of freedom provides a selectable level of attenuation of the feedback to the gain medium.

51 Claims, 7 Drawing Sheets

U.S. PATENT DOCUMENTS

| | | |
|---|---|---|
| 4,460,977 A | 7/1984 | Shimada et al. |
| 4,504,950 A | 3/1985 | AuYeung |
| 4,560,246 A | 12/1985 | Cotter |
| 4,583,227 A | 4/1986 | Kirkby |
| 4,770,047 A | 9/1988 | Arditty et al. |
| 4,839,614 A | 6/1989 | Hill et al. |
| 4,843,233 A | 6/1989 | Jeunhomme |
| 4,847,854 A | 7/1989 | Van Dijk |
| 4,870,269 A | 9/1989 | Jeunhomme et al. |
| 4,932,782 A | 6/1990 | Graindorge et al. |
| 4,994,677 A | 2/1991 | Graindorge |
| 5,028,395 A | 7/1991 | Sebille et al. |
| 5,050,179 A | 9/1991 | Mooradian |
| 5,058,124 A | 10/1991 | Cameron et al. |
| 5,103,457 A | 4/1992 | Wallace et al. |
| 5,115,677 A | 5/1992 | Martin et al. |
| 5,124,993 A | 6/1992 | Braunlich et al. |
| 5,141,316 A | 8/1992 | Lefevre et al. |
| 5,163,063 A | 11/1992 | Yoshikawa et al. |
| 5,172,185 A | 12/1992 | Leuchs et al. |
| 5,181,078 A | 1/1993 | Lefevre et al. |
| 5,181,214 A | 1/1993 | Berger et al. |
| 5,181,717 A | 1/1993 | Donntag et al. |
| 5,185,643 A | 2/1993 | Vry et al. |
| 5,218,610 A | 6/1993 | Dixon |
| 5,225,930 A | 7/1993 | Land et al. |
| 5,263,037 A * | 11/1993 | Trutna et al. ............... 372/20 |
| 5,270,791 A | 12/1993 | Lefevre et al. |
| 5,305,330 A | 4/1994 | Rieder et al. |
| 5,319,668 A | 6/1994 | Luecke |
| 5,321,717 A | 6/1994 | Adachi et al. |
| 5,327,447 A | 7/1994 | Mooradian |
| 5,331,651 A | 7/1994 | Becker et al. |
| 5,347,527 A | 9/1994 | Favre et al. |
| 5,349,440 A | 9/1994 | DeGroot |
| 5,373,515 A | 12/1994 | Wakabayashi et al. |
| 5,387,974 A | 2/1995 | Nakatani |
| 5,412,474 A | 5/1995 | Reasenberg et al. |
| 5,414,280 A | 5/1995 | Girmay |
| 5,418,800 A | 5/1995 | Prior et al. |
| 5,420,687 A | 5/1995 | Kachanov |
| 5,428,700 A | 6/1995 | Hall |
| 5,438,579 A | 8/1995 | Eda et al. |
| 5,444,724 A | 8/1995 | Goto |
| 5,450,202 A | 9/1995 | Tisue |
| 5,473,625 A | 12/1995 | Hansen et al. |
| 5,543,916 A | 8/1996 | Kachanov |
| 5,583,638 A | 12/1996 | Cutler |
| 5,594,744 A | 1/1997 | Lefevre et al. |
| 5,606,439 A | 2/1997 | Wu |
| 5,631,736 A | 5/1997 | Thiel et al. |
| 5,651,018 A * | 7/1997 | Mehuys et al. ............... 372/50 |
| 5,673,129 A | 9/1997 | Mizrahi |
| 5,712,704 A | 1/1998 | Martin et al. |
| 5,719,674 A | 2/1998 | Martin et al. |
| 5,737,109 A | 4/1998 | Goodwin |
| 5,751,750 A | 5/1998 | Friede et al. |
| 5,760,391 A | 6/1998 | Narendran |
| 5,777,773 A | 7/1998 | Epworth et al. |
| 5,802,085 A | 9/1998 | Lefevre et al. |
| 5,812,716 A | 9/1998 | Ohishi |
| 5,825,792 A | 10/1998 | Villenueve et al. |
| 5,848,092 A | 12/1998 | Mitsumoto et al. |
| 5,862,162 A * | 1/1999 | Maeda ............... 372/20 |
| 5,872,881 A | 2/1999 | Rossi et al. |
| 5,886,785 A | 3/1999 | Lefevre et al. |
| 5,917,188 A | 6/1999 | Atkinson et al. |
| 5,943,352 A | 8/1999 | Fee |
| 5,946,331 A | 8/1999 | Amersfoort et al. |
| 5,991,061 A | 11/1999 | Adams et al. |
| 6,018,535 A | 1/2000 | Maeda |
| 6,026,100 A * | 2/2000 | Maeda ............... 372/20 |
| 6,034,799 A | 3/2000 | Hansen |
| 6,040,950 A | 3/2000 | Broome |
| 6,043,883 A | 3/2000 | Leckel et al. |
| 6,044,095 A | 3/2000 | Asano et al. |
| 6,061,369 A | 5/2000 | Conradi |
| 6,064,501 A | 5/2000 | Roberts et al. |
| 6,081,539 A | 6/2000 | Mattori et al. |
| 6,084,695 A | 7/2000 | Martin et al. |
| 6,108,355 A | 8/2000 | Zorabedian |
| 6,115,121 A | 9/2000 | Erskine |
| 6,115,401 A | 9/2000 | Scobey et al. |
| RE37,044 E | 2/2001 | Wu |
| 6,192,058 B1 | 2/2001 | Abeles |
| 6,205,159 B1 | 3/2001 | Sesko et al. |
| 6,215,802 B1 | 4/2001 | Lunt |
| 6,229,835 B1 | 5/2001 | Tomaru et al. |
| 6,243,517 B1 | 6/2001 | Deacon |
| 6,246,480 B1 | 6/2001 | O'Brien |
| 6,249,364 B1 | 6/2001 | Martin et al. |
| 6,249,365 B1 | 6/2001 | Mizrahi et al. |
| 6,252,718 B1 | 6/2001 | Lefevre |
| 625,971 A1 | 7/2001 | DeCain et al. |
| 6,282,215 B1 | 8/2001 | Zorabedian et al. |
| 6,301,274 B1 * | 10/2001 | Tayebati et al. ............... 372/20 |
| 6,301,280 B1 | 10/2001 | Broutin et al. |
| 6,304,586 B1 | 10/2001 | Pease et al. |
| 6,314,115 B1 * | 11/2001 | Delfyett et al. ............... 372/6 |
| 6,321,011 B2 | 11/2001 | Deacon |
| 6,324,204 B1 | 11/2001 | Deacon |
| 6,330,253 B1 | 12/2001 | Tuganov et al. |
| 6,331,892 B1 | 12/2001 | Green |
| 6,337,660 B1 | 1/2002 | Esman et al. |
| 6,366,592 B1 | 4/2002 | Flanders |
| 6,366,689 B1 | 4/2002 | Rao et al. |
| 6,404,538 B1 | 6/2002 | Chen et al. |
| 6,441,933 B1 | 8/2002 | Jang |
| 6,463,085 B1 * | 10/2002 | Tayebati ............... 372/20 |
| 6,532,091 B1 | 3/2003 | Miyazaki et al. |
| 2002/0048297 A1 | 4/2002 | Irie et al. |
| 2002/0126345 A1 | 9/2002 | Green et al. |
| 2002/0136104 A1 | 9/2002 | Daiber |

OTHER PUBLICATIONS

Scobey & Stupik, Stable Ultra–Narrow Bandpass Filters, SPIE, vol. 2262, pp. 37–46.

Siegman A.E. "An Introduction to Lasers and Masers," Mc–Graw–Hill, Inc. 1971.

Takahashi, H. "Temperature Stability of Thin–Film Narrow–Bandpass Filters Produced by Ion–Assisted Deposition" Applied Optics, vol. 34, No. 4, Feb. 1, 1995.

Zhang, X.X., "An Interference Filter Based External Cavity Laser For Dense Wavelength Division Multiplexing Applications" Coring OCA Corp. pp. 103–108.

Ketelsen, L. J. P., "Simple Technique for Measuring Cavity Loss in Semiconductor Laser," *Electronics Letters*, (Aug. 18, 1994), vol. 30, No. 17, pp. 1422–1424.

Shtengel, G. E., et al., "Internal Optical Loss Measurements in 1.3um InGaAsP Lasers," *Electronic Letters*, (Jul. 6, 1995), vol. 31, No. 14, pp. 1157–1159.

* cited by examiner

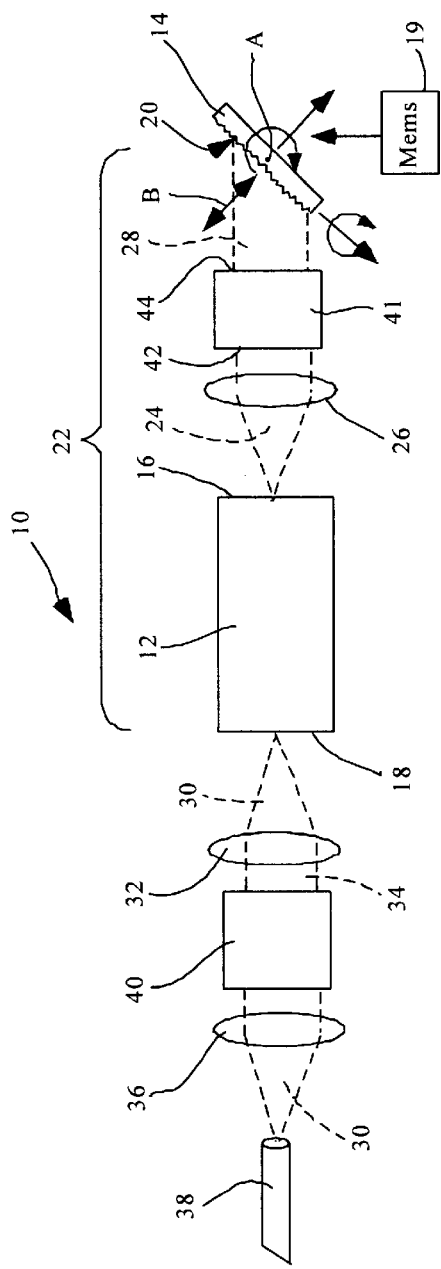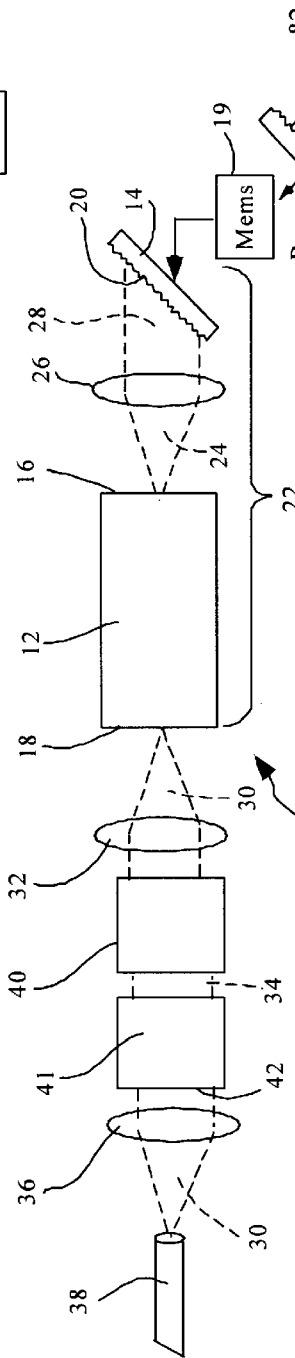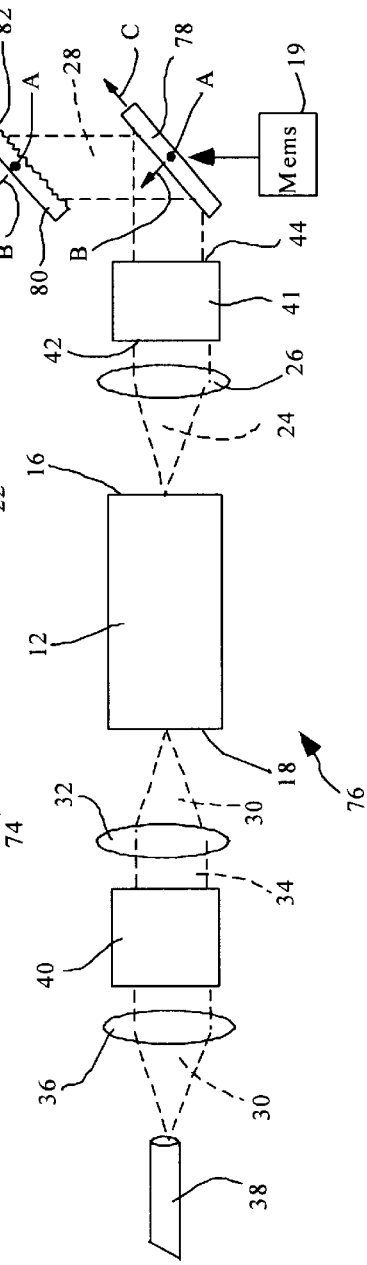

TUNABLE EXTERNAL CAVITY LASER

CROSS REFERENCE TO RELATED APPLICATIONS

This application is related to U.S. patent application Ser. No. 09/900,373, filed on Jul. 6, 2001, and incorporated herein by reference.

BACKGROUND OF THE INVENTION

The demand for increased bandwidth in fiberoptic telecommunications has driven the development of sophisticated transmitter lasers usable for dense wavelength division multiplexing (DWDM) systems wherein multiple separate data streams propagate concurrently in a single optical fiber. Each data stream is created by the modulated output of a semiconductor laser at a specific channel frequency or wavelength, and the multiple modulated outputs are combined onto the single fiber. The International Telecommunications Union (ITU) presently requires channel separations of approximately 0.4 nanometers, or about 50 GHz, which allows up to 128 channels to be carried by a single fiber within the bandwidth range of currently available fibers and fiber amplifiers. Greater bandwidth requirements will likely result in smaller channel separation in the future.

Telecom DWDM systems have largely been based on distributed feedback (DFB) lasers. DFB lasers are stabilized by a wavelength selective grating that is predetermined at an early step of manufacture. Unfortunately, statistical variation associated with the manufacture of individual DFB lasers results in a distribution of (wavelength) channel centers. Hence, to meet the demands for operation on the fixed grid of telecom wavelengths (the ITU grid), DFBs have been augmented by external reference etalons and require feedback control loops. Variations in DFB operating temperature permit a range of operating wavelengths enabling servo control; however, conflicting demands for high optical power, long lifetime, and low electrical power dissipation have prevented use in applications that require more than a single channel or a small number of adjacent channels.

Continuously tunable external cavity lasers have been developed to overcome the limitations of individual DFB devices. Tunable external cavity lasers, in order to provide effective side mode suppression and wavelength stability, require very stringent manufacturing tolerances. In order to meet these tolerances, expensive custom-made components are typically required for the external cavity lasers. Tuning has relied on the use of stepper motors to mechanically components, which reduces form factor, introduces vibration and shock sensitivity, reduces useful lifetime due to motor component wear, and increases the overall size and complexity of the external cavity lasers.

There is accordingly a need for an external cavity laser that is compact in size and has a small form factor, that is of simple, inexpensive construction, that provides for effective side mode suppression and wavelength stability during operation, that has reduced cavity loss and increased output power, and which has loose machining tolerances. The present invention satisfies these needs, as well as others, and overcomes the deficiencies found in the background art.

SUMMARY

The invention provides external cavity lasers apparatus and methods that allow fast tuning, high wavelength stability, low cavity losses, and form factors that are comparable to solid state, fixed wavelength lasers. The apparatus of the invention comprises a gain medium emitting a light beam, a tunable element positioned in the light beam and configured feed back light of a selected wavelength to the gain medium, and a microelectromechanical systems (MEMS) actuator element operatively coupled to the tunable element. The MEMS actuator element may be configured to actuate the tunable element according to a first degree of freedom of movement to select the wavelength of the feedback to the gain medium, and to actuate the tunable element according to a second degree of freedom of movement to provide phase control of the feedback. The MEMS actuator element and tunable element may additionally be configured such that actuation of the tunable element with respect to a third degree of freedom of movement provides a selectable level of attenuation of the feedback to the gain medium.

The tunable element and MEMS actuator are configured to provide orthogonalized wavelength selection control and phase control of the feedback from the tunable element to the gain medium according to independent orthogonalized positional adjustments to the tunable element. In other words, wavelength tuning is uncoupled or decoupled from tuning of the external cavity tuning, such that the tuning mechanisms for wavelength selection and external cavity length adjustment operate independently or orthogonally with respect to each other. The adjustment of the wavelength passband thus has minimal effect on the effective cavity length, and adjusting the effective cavity length has minimal effect on the passband of the tunable element.

In certain embodiments, the tunable element may comprise a movable grating that is positioned in the light beam and configured to selectively feed back light to the gain medium according to positioning of the grating by the MEMS actuator. The grating is rotatable about a first axis to provide wavelength selection of the light fed back to the gain medium, and is translatable along a second axis to provide phase control of the light fed back to the gain medium. The rotational adjustment about the first axis to control wavelength selection is orthogonalized with respect to the translational adjustment along the second axis to control external cavity length, such that adjusting the grating for wavelength selection does not effect, or minimally effects, phase adjustment. Similarly, translatational adjustment of the grating along the second axis to provide phase control does not effect, or minimally effects, wavelength selection. The grating may additionally be rotatable about a third axis to provide attenuation control to the light fed back to the gain medium. The first axis may be parallel or substantially parallel to the grating face of the movable grating, and the second axis may be perpendicular or substantially perpendicular to the grating face and first axis. The third axis may be substantially parallel to the grating face, and substantially perpendicular to the first and second axes.

In some embodiments, the movable grating is a reflective grating and, together with a reflective facet of the gain medium, defines an external laser cavity. The grating may be etched or otherwise formed onto a MEMS mirror surface. The grating may be positioned with respect to the reflective facet of the gain medium such that external laser cavity is dimensioned to suppress lasing modes at wavelengths other than a selected wavelength. Specifically, the grating and gain medium may be positioned such that the external laser cavity is of sufficiently short length that the external cavity axial modes are spaced sufficiently far apart such that unwanted mode hopping from a selected wavelength to an external cavity mode will not occur during laser operation.

The apparatus may, in certain embodiments, also comprise a mode filtering element positioned in the optical path, which may be in the form of an etalon configured to define a plurality of transmission peaks corresponding to selectable feedback wavelengths.

In other embodiments, the tunable element may comprise a movable mirror together with a stationary grating, with the movable mirror operatively coupled to the MEMS actuator element. The mirror is rotatable about a first rotational axis to control feedback wavelength and translatable along a second axis to control feedback phase. In certain embodiments, the mirror may additionally be rotatable about a third axis to control level of feedback attenuation.

The methods of the invention comprise emitting a light beam by a gain medium, positioning a tunable element in the light beam, coupling the tunable element to a microelectromechanical (MEMS) actuator, feeding back light to the gain medium by the tunable element, and positionally adjusting the tunable element with respect to a first degree of freedom of movement, via the MEMS actuator, to select wavelength of the light fed back to the gain medium. The methods may additionally comprise positionally adjusting the tunable element with respect to a second degree of freedom of motion to adjust phase of the light fed back to the gain medium. The positional adjusting with respect to the first and second degrees of freedom may be carried out orthogonally, such that positional adjustment of the tunable element to adjust wavelength does not affect phase adjustment provided by the tunable element. The methods may further comprise positionally adjusting the tunable element with respect to a third degree of freedom of movement to control attenuation of the light fed back to the gain medium.

The positioning of the tunable element in the light beam may in certain embodiments comprise positioning a reflective grating in the light beam. The grating may be etched, engraved or embossed or otherwise formed, using photolithographic or other technique, onto the surface of a MEMS-movable mirror that is coupled to a MEMS actuator. Positionally adjusting the grating to select wavelength of the feedback light may comprise rotatably actuating the grating with respect to a first axis that is parallel or substantially parallel to the grating face. Positionally adjusting the grating to select or adjust the phase of the feedback light may comprise translating the grating with respect to a second axis that is perpendicular or substantially perpendicular to a grating face thereof. The first and second axes are configured such that wavelength selection and phase selection are orthogonalized. Positionally adjusting the grating to control attenuation of or otherwise control the optical power of the feedback light may additionally comprise rotatably actuating the grating with respect to a third axis that is substantially perpendicular to the first and second axes.

In certain embodiments, the positioning of the grating in the light beam may comprise positioning the grating such that the grating and an reflective facet of the gain medium define an external laser cavity that is dimensioned to suppress lasing modes at wavelengths other than a selected wavelength. The grating and gain medium may be positioned such that the external laser cavity is of sufficiently short length that the external cavity axial modes are spaced sufficiently far apart such that unwanted mode hopping from a selected wavelength to an external cavity mode will not occur during laser operation. In some embodiments, the method may comprise positioning a mode filtering element in the light beam, and suppressing feedback at unselected wavelengths with the mode filtering element.

The apparatus and methods of the invention provide external cavity lasers that can be manufactured and assembled with relaxed tolerances and inexpensive components than is presently possible. The use of a MEMS actuator for positioning of a tunable element as provided by the invention allows shorter external cavity dimensions and smaller package sizes than have previously been achieved. In certain embodiments, the external cavity may be of sufficiently small dimension that effective suppression of unwanted wavelengths is achieved without the use of an intracavity filter or mode suppression element. The multiple degrees of freedom of movement of the tunable element allow wavelength selection, phase control and output power control during laser operation by appropriate actuation of the tunable wavelength reflection element. Adjustment to provide wavelength selection and phase control may be carried out independently or orthogonally, such that adjustments to a tunable element to provide wavelength selection minimally affect external cavity length or phase control adjustment. The short external cavity length and use of MEMS actuation also allows dynamic provisioning and rapid tuning or adjustment of output wavelength, feedback phase, and output power during laser operation. These and other objects and advantages of the invention will be apparent from the detailed description below.

BRIEF DESCRIPTION OF THE DRAWINGS

The invention will be more fully understood by reference to the following drawings, which are for illustrative purposes only.

FIG. 1 is a schematic illustration of a tunable external cavity laser apparatus in accordance with the invention.

FIG. 5 is a schematic illustration of another embodiment of a tunable external cavity laser apparatus in accordance with the invention.

FIG. 6 is a schematic illustration of another embodiment of a tunable external cavity laser apparatus in accordance with the invention.

DETAILED DESCRIPTION OF THE INVENTION

Figure 2:
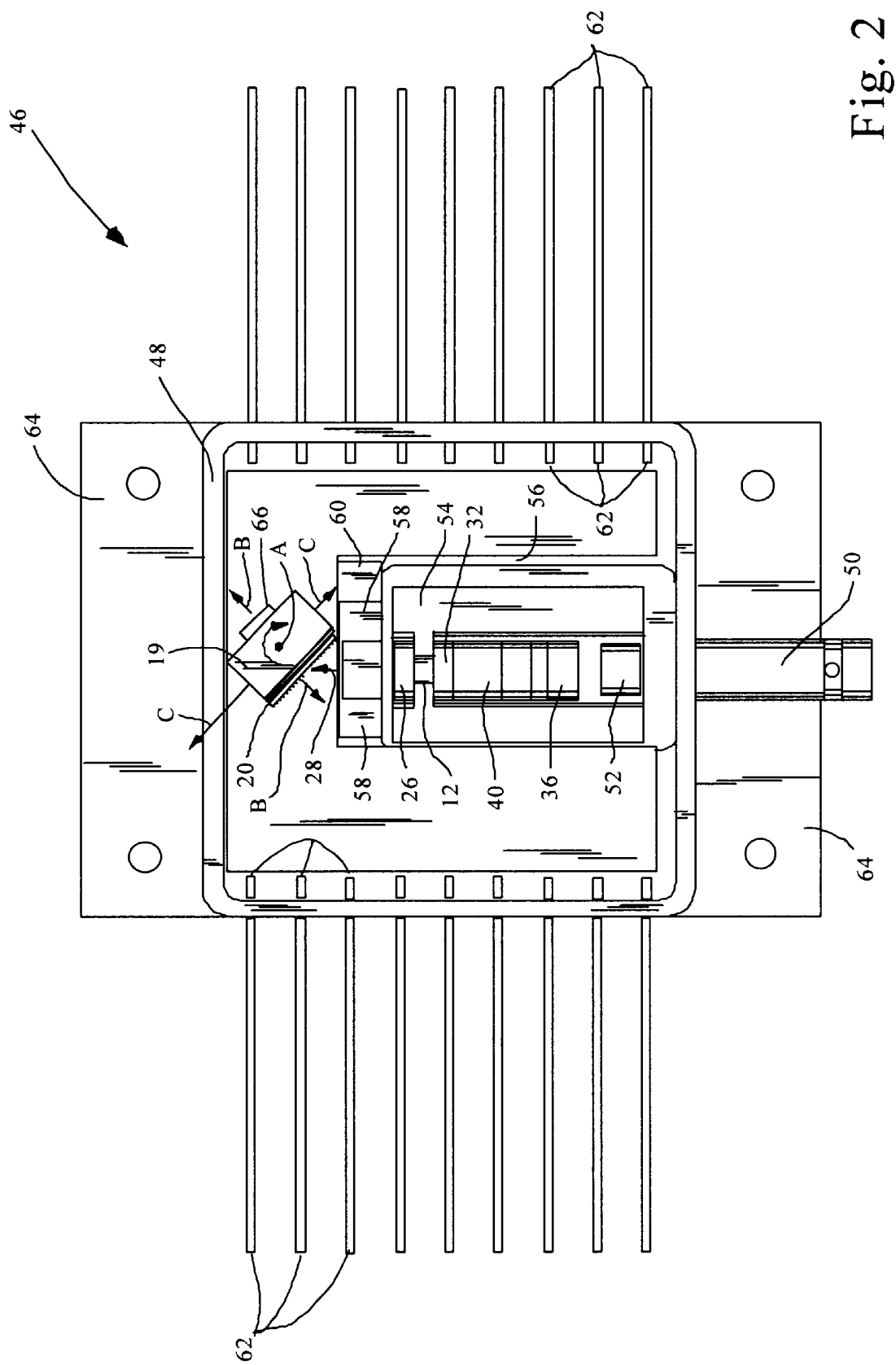
FIG. 2 is a top plan view of the tunable external cavity laser apparatus of FIG. 1 shown mounted on a sled in a hermetically sealed container.

Referring more specifically to the drawings, for illustrative purposes the present invention is embodied in the apparatus shown in FIG. 1 through FIG. 9. It will be appreciated that the apparatus may vary as to configuration and as to details of the parts, and that the method may vary as to details and the order of the acts, without departing from the basic concepts as disclosed herein. The invention is disclosed primarily in terms of use with an external cavity laser. The invention, however, may be used with various types of laser devices and optical systems. It should also be understood that the terminology used herein is for the purpose of describing particular embodiments only, and is not intended to be limiting, since the scope of the present invention will be limited only by the appended claims. The relative sizes of components and distances therebetween as shown in the drawings are in many instances exaggerated for reason of clarity, and should not be considered limiting.

Referring now to FIG. 1, there is shown an external cavity laser apparatus 10 in accordance with the invention. The apparatus 10 includes a gain medium 12 and a tunable wavelength selection element that is shown in FIG. 1 as a reflective grating 14. Gain medium 12 may comprise a conventional Fabry-Perot diode emitter chip and has an anti-reflection (AR) coated front facet 16 and a reflective or partially reflective rear facet 18. Grating 14 is reflective, and an external laser cavity 22 is defined by rear facet 18 and the surface or face 20 of grating 14. Gain medium 12 emits a coherent light beam 24 from front facet 16 that is collimated by lens 26 to define an optical path 28. Grating 14 in other embodiments may comprise a transmissive grating, a prism, an interference filter, or other tunable element capable of providing wavelength selection.

Gain medium 12 emits an output beam 30 from facet 18, which is collimated by lens 32 along an output path 34. The beam 30 from path 34 is focused by lens 36 into an optical fiber 38. An optical isolator 40 is positioned in optical path 34 between lenses 32, 26 to prevent return of light from fiber 38 into gain medium 12. A coarse spectrometer (not shown) may also be positioned in output path 34 between lenses 32, 26 to provide monitoring of output wavelength during the operation of the apparatus 10.

Grating 14 is operatively coupled to a microelectromechanical system or MEMS actuator element 29 that provides for positional adjustment of grating 14 during the operation of laser apparatus 10 as described further below. The terms "microelectromechanical system actuator" and "MEMS actuator" as used herein refer to actuator devices based on microsystems technology that are fabricated using micromachining techniques such as those used in the semiconductor industry. Numerous MEMS actuator devices that can provide selective actuation of components are known and commercially available. The use of MEMS actuation of a tunable wavelength selection element in an external cavity laser in accordance with the invention offers several advantages, also discussed more fully below, that have heretofore not been available in external cavity lasers. In certain embodiments, other actuator systems, such as stepper motors, voice coil actuators and the like, may be used to position grating 14 in accordance with the invention.

Grating 14 is positioned in optical path 28 and provides optical feed back to gain medium 12 along path 28. Reflective grating face 20 includes a plurality of ridges, grooves or other diffractive features (not referenced) thereon that are dimensioned and configured to diffract light beam 24. In the embodiment shown in FIG. 1, grating 14 and gain medium 12 are positioned in a "Littrow" configuration, although other configurations or arrangements of grating 14 and gain medium 12 may alternatively be used with the invention. Grating 14 is movable, and may be positionally adjusted to select the wavelength of light that is fed back to gain medium 12 by grating 14, the phase of the feedback light to gain medium 12, and the amount or optical power of the feedback to gain medium 12 by positional adjustment grating 14. The positional adjustment of grating 14 in accordance with the invention allows wavelength selection and phase adjustment of the feedback to gain medium 12, by selective positional adjustment of grating, to be carried out orthogonally or independently, such that wavelength selection adjustment does not affect or minimally effects phase adjustment, and vice versa.

Grating 14 is movable with respect to a first degree of freedom of motion to provide wavelength selection. In the embodiment shown, grating 14 is rotatable about a first axis A (normal to page) that is parallel to or substantially parallel to grating face 20, in order to provide for wavelength selection. The diffractive nature of grating 14 imparts a spatial separation to light of different wavelengths in beam 24, and rotatable adjustment of grating 14 about axis A controls the particular diffraction, and hence the particular wavelength, that is returned or fed back to gain medium 12.

Positional adjustment of grating 14 with respect to a second degree of freedom of movement can provide for adjustment of the phase of the light fed back to gain medium 12 by grating 14. In the embodiment of FIG. 1, grating 14 is translatably adjustable with respect to a second axis B. Translation of grating 14 along axis B or in the direction of axis B alters the distance between grating face 20 and gain medium facet 18, and thus alters the length of external cavity 22. Axis B as shown is perpendicular or substantially perpendicular or normal to axis A and to grating face 14.

External cavity 22 defines a plurality of cavity modes (not shown) that result in transmission maxima that are periodically spaced apart in wavelength. During laser operation at a selected wavelength, lasing may jump or "hop" to an external cavity mode that is adjacent to the selected wavelength. Such "mode hops" are generally undesirable, and adjustment of the length of external cavity 22 are made during laser operation to optimally position the external cavity modes with respect to the selected wavelength and thus avoid unwanted mode hopping. Selective translational actuation of grating 14 along axis B adjusts the length of external cavity 22 and provides a phase adjustment to the light fed back to gain medium 12 from grating 14, and serves to position the external cavity modes so that mode hopping is avoided. This phase adjustment can also be used to provide fine tuning of the selected wavelength.

Translation of grating 14 along axis B to provide phase control for positioning of external cavity modes can be carried out without varying the rotation of grating 14 with respect to axis A. Phase adjustment and wavelength adjustment thus can be easily orthogonalized or made independent of each other in the apparatus 10, and wavelength adjustment for the laser apparatus 10 by angle tuning of grating 14 can be made without effecting, or minimally effecting, external cavity length. Similarly, translation of grating 14 along axis B to adjust external cavity length does not affect the orientation of grating with respect to axis A. The orthogonal tuning of a wavelength selection element and an external cavity length tuning element in an external cavity laser is also described in U.S. patent application Ser. No. 09/900,373 filed on Jul. 6, 2001, the disclosure of which is incorporated herein by reference.

Grating 14 may also be positionally adjustable with respect to a third degree of freedom of motion to control the amount or level of feedback to gain medium 12 from grating 14, and hence control the output power level of the apparatus 10. In the apparatus 10, rotatable motion of grating 14 about axis C provides this third degree of freedom of motion. Rotation of grating 14 about axis C alters the alignment of the return beam (not shown) towards gain medium and thus can control the amount of level of light fed back to gain medium 12. Rotation of grating 14 about axis C also changes the orientation of grating 14 with respect to the polarization of light beam 24, which also effects the level of feedback. Rotation of grating 14 about axis C does not effect or alter the orientation or angle of grating with respect to axis A, and thus does not effect wavelength selection. Rotation of grating 14 with respect to axis C during laser operation provides several advantages, which are discussed further below.

The apparatus 10 includes a filter element that provides for suppression of lasing by the apparatus 10 at unwanted wavelengths. In the embodiment of FIG. 1, the filter element is shown as a Fabry-Perot etalon 41 positioned in optical path 28. Etalon 41 includes partially reflective faces 42, 44 that, together with the refractive index of etalon 41, are configured to define a plurality of transmission peaks (not shown) for light beam 24. In this regard, etalon 41 serves as a wavelength locker or grid generator, with the plurality of transmission peaks of etalon 41 corresponding to discrete selectable wavelengths that may be chosen or selected by rotation of grating about axis A as related above. The transmission peaks of etalon 41 thus, for example, may correspond in wavelength to the wavelengths of the International Telecommunications Union (ITU) grid channels. Lasing at wavelengths other than wavelengths corresponding to the transmission peaks of etalon 41 are suppressed. Etalon 41 thus provides for suppression of external cavity modes at unwanted wavelengths.

In some embodiments of the invention, the length of external cavity 22 may be sufficiently short such that effective external cavity mode suppression is achieved without the presence of etalon 41. In certain embodiments, etalon 41 may be actively tuned during laser operation to vary the free spectral range of etalon 41, and hence the wavelength location of transmission peaks defined by the etalon 41. Tuning of etalon may be carried out mechanically via tilt adjustment or via thermo-optic, electro-optic, acousto-optic or other mechanism where the material of etalon 41 has a refractive index that is responsive to temperature, voltage or other controllable property. The active tuning of a grid generator etalon is described more fully in U.S. patent application Ser. No. 09/900,474 filed on Jul. 6, 2001, the disclosure of which is incorporated herein by reference.

Figure 3:
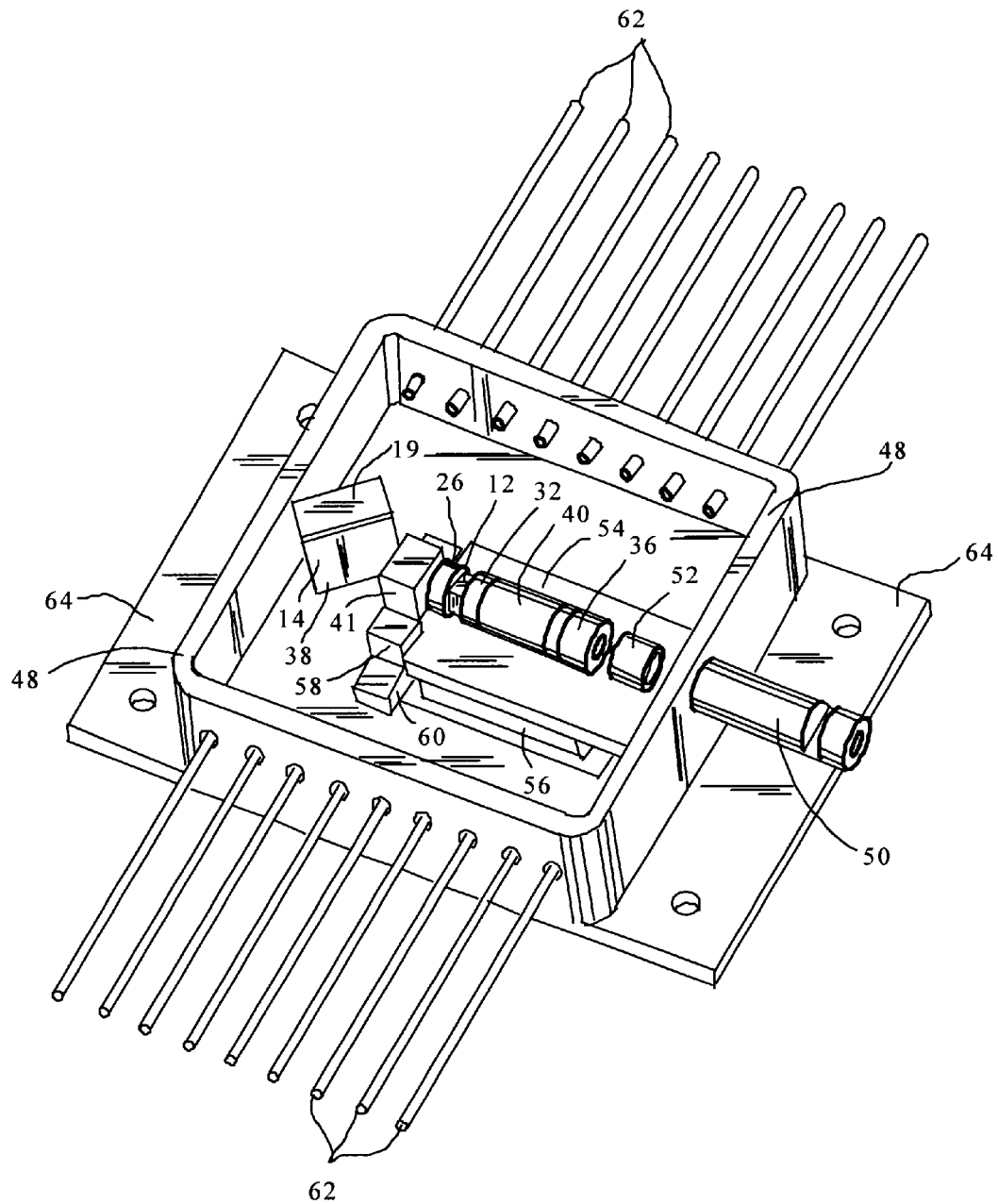
FIG. 3 is a perspective view of the tunable external cavity laser apparatus of FIG. 2.

Referring to FIG. 2 and FIG. 3 as well as FIG. 1, the laser apparatus 10 is shown embodied in the apparatus 46, wherein like parts are denoted with like reference numbers. In the apparatus 46, the external cavity laser 10 is enclosed in a hermetically sealable container 48. The lid (not shown) of container 48 is omitted for clarity. Container 48 allows the laser 10 to be sealed within an inert atmosphere to prevent contamination and/or degradation of optical surfaces on the various components of laser 10, and particularly the anti-reflection coating on facet 16 (not shown in FIG. 2 and FIG. 3) of gain medium. A tubular support 50 holds an optical fiber (not shown) and allows the optical fiber to communicate with the hermetically sealed interior of container 48. A ferrule 52 is provided to position the end of the optical fiber so that output from the laser apparatus 10 may be focused by lens 36 into the fiber. The use of an external cavity laser in a hermetically sealable enclosure is also described in U.S. patent application Ser. No. 09/900,423 filed on Jul. 6, 2001, the disclosure of which is incorporated herein by reference.

As shown in FIG. 2 and FIG. 3, gain medium 12 and optical isolator 40 are configured for selective thermal control independently from etalon 41 and grating 14. Gain medium 12 and optical isolator 40 are mounted on a thermally conductive platform or pad 54. Lenses 26, 36 and ferrule 52 may also be mounted on platform 54 as shown. Platform 54 in turn is mounted on a thermal control element 56, which may comprise a conventional thermoelectric controller or TEC. Thermal control element 56 allows selective thermal control of gain medium 12 and optical isolator during laser operation. The use of selective thermal control of a gain medium and optical isolator in an external cavity laser is also described in U.S. patent application Ser. No. 09/900,429 filed on Jul. 6, 2001, the disclosure of which is incorporated herein by reference. Etalon 41 is mounted on a thermally conductive platform 58, which in turn is mounted on a separate thermal control element 60, to allow active thermal control of etalon 41 independently from the thermal control of gain medium 12 and isolator 40.

A plurality of electrical leads communicate 62 with the interior of container 48 to provide power to gain medium 12, to MEMS actuator 19, to thermoelectric controllers 56, 61, and to logic elements and/or circuitry (not shown) that is associated with controlling the current delivered to gain medium, control of thermoelectric controllers 56, 60, and control of the degrees of freedom of motion with respect to axes A and B provided by MEMS actuator 19. Container 48 includes flanges 64 to allow mounting of the apparatus 46 onto suitable surfaces (not shown).

The MEMS actuator 19 provides for rotational motion of grating 14 about axis A, translation motion with respect to axis B, and rotational motion about axis C as noted above. MEMS rotational and translational actuation may be carried out through a variety of mechanisms, including mechanical, electrostatic, piezoresistive, piezoelectric, thermoelectric electromagnetic and/or other interaction of micromachined parts. Micromachining may involve, for example, conventional photolithographic, material deposition, etching, polishing, plating and other techniques used in semiconductor device manufacture, to form actuator components. The fabrication and use of various types of MEMS devices are known in the art and are described, for example, in "Introduction to Microelectromechanical Systems Engineering" by Nadim Maluf and published by Artech House, Inc., Norwood, Mass. (2000), the disclosure of which is incorporated herein by reference.

Figure 4:
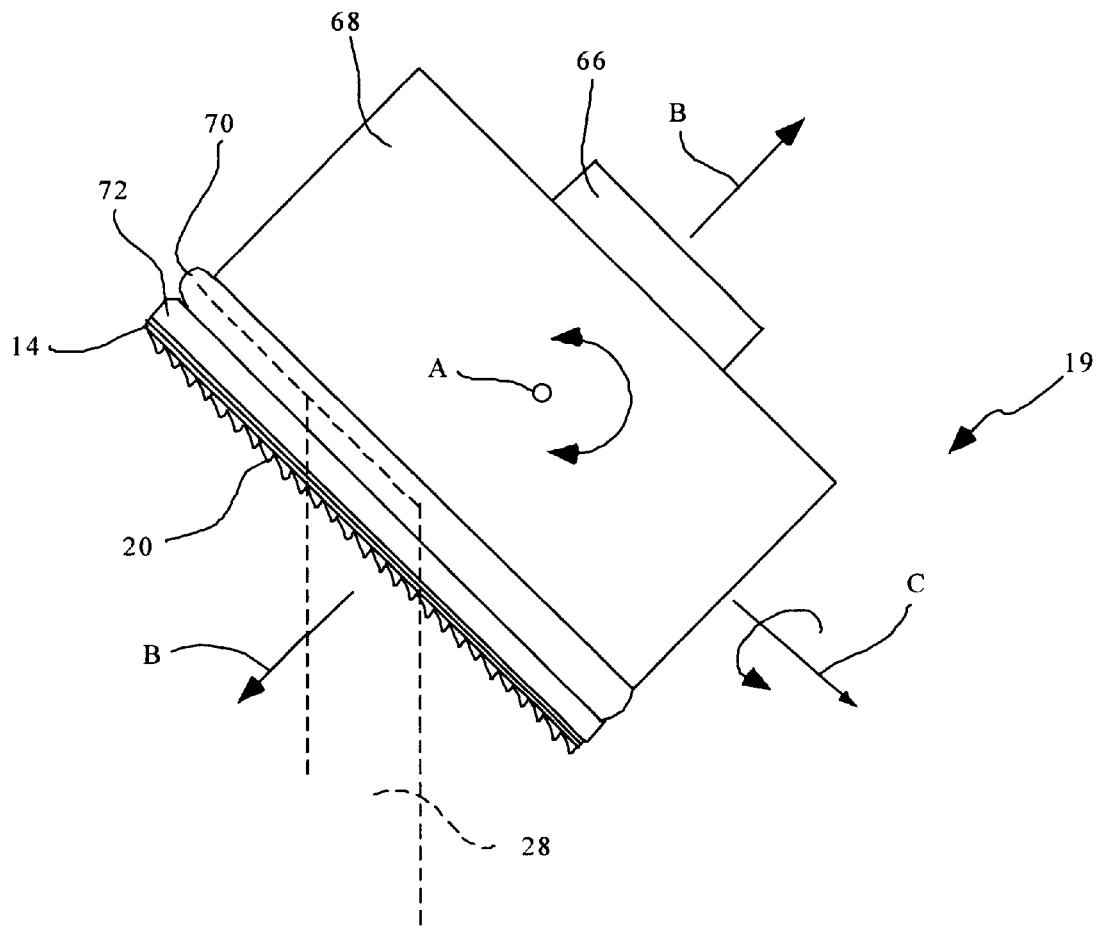
FIG. 4 is a top plan view of the grating and MEMS actuator of the tunable external cavity laser apparatus of FIG. 2.

Numerous micromachined MEMS rotational and translational driver configurations may be used with the invention. Referring more particularly to FIG. 4, as well as FIG. 1 through FIG. 3, MEMS actuator 19 is shown as includes one or more drive elements 66 which are contained or housed in a carrier 68. Drive element 66 is coupled to carrier 68 by one or more spring elements, hinge elements, gimbal elements, other movable elements (not shown) that are internal to carrier 68 and which movably connect drive element 66 to carrier 68. Drive element 66, carrier 68, and the movable connecting elements therebetween may be fabricated from the same substrate or from different components. Drive element 66 is movable with respect to carrier via actuation according to mechanical, electrostatic, piezoresistive, piezoelectric, thermoelectric electromagnetic and/or other effect as noted above.

Drive element 66 and carrier 68 are configured to provide a range of movement to grating 14 that includes rotation about axis A, translation along axis B, and rotation about axis C as noted above. In this regard, drive element 66 is operatively coupled to a transmitter substrate 70, and transmitter substrate 70 is operatively coupled to a MEMS engine element 72. Grating 14 is provided by the reflective surface 20 of MEMS engine 72, which may comprise a polished surface of semiconductor substrate material. A plurality of grating lines, grooves or other diffractive features (not referenced) are included on surface 20 to define grating 14, and may be formed on surface 20 via conventional photolithographic techniques or other methods. The grating lines as shown in FIG. 4 and the other FIGs. herein are only illustrative and are not shown to scale, and are not necessarily indicative of grating orientations that would be used during laser operation.

MEMS actuator 19 as described above provides positional adjustment to grating along three degrees of freedom of movement using a single actuator device. In certain embodiments, multiple MEMS actuators may be utilized, with each actuator configured to provide a desired positional degree of freedom to grating 14. Thus, three separate MEMS actuator devices may be used in place of the single device 19, with one MEMS actuator configured to provide rotational adjustment of grating 14 about axis A, another MEMS actuator configured to provide translational adjustment of grating 14 along axis B, and a third MEMS actuator used to provide rotational adjustment to grating 14 about axis C. Various arrangements and configurations of MEMS actuators for positioning of grating 14 in accordance with the invention are possible, and will suggest themselves to those skilled in the art.

Referring again to FIG. 1 in particular, in the operation of laser apparatus 10, gain medium 12 is current-pumped in a conventional manner, and emits beam 24 from antireflection coated facet 16 which collimated along path 28 and directed to grating 14. Grating 14 returns or feeds back light of a selected wavelength (according to the angle of grating with respect to axis A) along path 28 to gain medium 12 to provide lasing at the selected wavelength. Etalon 41 creates a plurality of transmission peaks, and the selected wavelength corresponds with one of these transmission peaks. Lasing at other wavelengths, which may arise from the presence of external cavity modes as described above, is suppressed by etalon 41. During lasing, a portion of the optical output from gain medium 12 exits partially reflective facet 18. This output is collimated and directed along output path 34 through optical isolator 40, and then focused into fiber 38 for use.

When a change in the lasing wavelength is desired, MEMS actuator 19 drives grating 14 rotatably with respect to axis A to change the diffraction, and hence the selected wavelength, that is returned to gain medium. A controller element (not shown) may be used in association with MEMS actuator 19 to provide control signals thereto to drive or actuate grating 14 to positions corresponding to desired or selected wavelengths. The relation of grating position with selectable wavelengths may be embodied in a stored lookup table that is consulted by the controller when a change in wavelength selection is made. The relatively small size of MEMS actuator 19 allows rapid wavelength tuning. Using the apparatus of FIG. 1, wavelength tuning across a 40 nanometer channel spacing at sub-microsecond times, and channel switching on the order of milliseconds, are achievable.

MEMS actuator 19 may additionally translate grating 14 along axis B to "trim" or otherwise adjust the length of external cavity 28 to provide fine tuning of the selected wavelength and to prevent mode hopping to external cavity modes adjacent to the selected wavelength as described above. Translational adjustment of grating 14 along axis B may be made via use of a servo system (not shown). In such a servo system, for example, a sensor is used to monitor the output power of the apparatus 10, either by optically monitoring output or by electrically monitoring of voltage across gain medium 12 during laser operation. Detection of non-optimal output power gives rise to error signals, which are then used by the servo system to drive MEMS actuator 19 to translate grating 14 along axis B until optimal output power is detected. The use of servo systems to control external cavity length are disclosed in U.S. patent application Ser. Nos. 09/900,426 and 09/09/900,443, both filed on Jul. 6, 2001, the disclosures of which are incorporated herein by reference.

During the operation of the laser apparatus 10, grating 14 will typically be oriented to maximize the level of feed back to gain medium 12 at the selected wavelength. In many instances, however, it may be desirable to vary the orientation of grating 14 with respect to the polarization orientation of light beam 24 during laser operation to control the amount of level of feedback to gain medium 12 from grating 14, and hence control the output power level of the apparatus 10. This is achieved by rotation of grating 14 about axis C by MEMS actuator 19. Active control of the pitch of grating 14 by rotation of grating about axis C provides rapid, accurate control of the output power level of the apparatus.

Rotation of grating 14 with respect to axis B allows the output from apparatus 10 to be "turned off" without actually powering down the diode gain medium 12. The output of laser apparatus 10 can thus be briefly interrupted, by pitch adjustment of grating with respect to axis C, without power down of gain medium, while wavelength selection adjustment is made by rotational adjustment of grating 14 with respect to axis A. Due to the small size of MEMS actuator 19 and rapid rotational movement that it can impart to grating 14, temporary "power downs" for the apparatus on the order microsecond duration or less can be achieved.

Active pitch control of grating 14 by rotation of grating 14 with respect to axis B allows the apparatus 10 to provide a steady level of output power in situations where environmental fluctuation may causes unwanted variation in laser output power. One such source of environmental fluctuation is current fluctuation when the current supply to gain medium 12 is uneven or not "clean". During external cavity laser operation, spurious fluctuation in the level of current delivered to the laser gain medium causes unwanted fluctuation in the level of output power from the laser. Current fluctuation can be controlled using a "roll off" filter to provide a "clean" current to the gain medium. The use of such a filter, however, prevents active control of the current delivered to the laser gain medium. The active pitch control of grating 14 by MEMS actuator 19 allows steady laser output power without the use of a filter to provide a clean current.

Pitch control of grating 14 as described above may also be used to maintain a steady or even level of power output over the lifetime of a laser apparatus. The pitch of grating 14 with respect to axis C may be initially adjusted to provide a sub-maximum output power. As the diode gain medium 12 and antireflection coating 14 on facet 16 age and deteriorate due to repeated use, the level of output power achievable from the apparatus 10 will drop off. Period adjustment of the pitch of grating 14 to maintain a constant output power level avoids this effect. Pitch control of grating 14 with respect to axis C also may be used during manufacture or assembly of the apparatus.

Active pitch control of grating 14 to provide a constant output power may involve use of a servo mechanism (not shown) to monitor laser output power and make corresponding adjustments to the pitch of grating 14. The servo mechanism may involve monitoring of output power of the apparatus 10, with detection of non-optimal output power resulting in error signals that are then used by the servo system to drive MEMS actuator 19 to rotate grating 14 about axis C until optimal output power is again detected. Monitoring of output power may be carried optically, or electrically by monitoring voltage across gain medium 12, as related above. Servoing of grating pitch to output power may also be carried out by introducing a frequency dither or modulation to the pitch of grating, and then monitoring the frequency dither. The use of servo systems using introduction of a frequency dither to an optical element to control external cavity length are disclosed in U.S. patent application Ser. Nos. 09/900,426 and 09/09/900,443, filed on Jul. 6, 2001 and incorporated herein by reference.

Reference is now made to FIG. 5, wherein another embodiment of an external cavity laser apparatus 74 is shown, with like reference numbers used to denote like parts. In the apparatus 74, etalon 41 external to cavity 22, and is positioned in output beam 40. Etalon 41 may be located before isolator 40, or elsewhere in output path 34. Grating 14 is operative coupled to a MEMS actuator 19 as described above, and is positionable by MEMS actuator 19 to control wavelength selection, external cavity length and power level as described above. Etalon 41 operates in the same was when in an intracavity location as shown in FIG. 1, by defining selectable transmission bands or peaks, and providing for suppression of lasing at wavelengths other than the selectable transmission bands. In other respects, the operation of laser apparatus 74 is substantially the same as described above for the apparatus 10 of FIG. 1.

Referring now to FIG. 6, there is shown still another embodiment of an external cavity laser apparatus 76 in accordance with the invention, with like reference numbers used to denote like parts. In the apparatus 76, a movable reflective element or mirror 78 is operatively coupled to MEMS actuator 19. Movable mirror 78 reflects beam 24 to a stationary grating element 80, such that optical path 28 extends from mirror 78 to grating 80. Grating 80 includes a reflective surface 82 with a plurality of grating lines (not referenced) etched thereon to provide for diffraction of light beam 24 in the manner described above. The external cavity (not referenced) in the apparatus 76 is defined or delineated by grating surface 80 and facet 18 of gain medium 12, such that the external cavity is "folded" about mirror 78.

Mirror 78 is movable with respect to optical path 28 according to operation of MEMS actuator 19, and is rotatable about axis A, translatable along axis B, and rotatable about axis B in the same manner as the grating 14 in the apparatus 10 described above. Rotation of mirror about axis A by MEMS actuator 19 alters the diffraction from stationary grating 80 that is returned from grating 80 to mirror 78, and thus provides for selection of a wavelength of light that is fed back to gain medium 12 by mirror 78 along optical path. Translation of mirror along axis B by MEMS actuator 19 adjusts the length of the external cavity and allows cavity "trimming" adjustment to avoid unwanted mode hopping and to fine tune selected feedback wavelength as described above. Rotation of mirror 78 about axis C by MEMS actuator 19 alters the amount of light that is returned from grating 80 to mirror 78, and hence controls the amount or level of feed back that is returned from mirror 78 to gain medium 12.

The apparatus 76 thus operates in a manner that is similar to the apparatus 10 and 74 described above, with the primary exception being that positional adjustment of an intracavity mirror 78 with respect to a stationary grating 80, rather than positional adjustment of a grating, is used to control the wavelength selection, external cavity length, and power attenuation operations described above. The same degrees of freedom of movement of mirror 78 are used to perform the wavelength selection control, external cavity length control, and power attenuation control, as described above for the grating 14 of apparatus 10. In other respects the operation of the laser apparatus 76 is substantially the same as described above for the apparatus 10.

Figure 7:
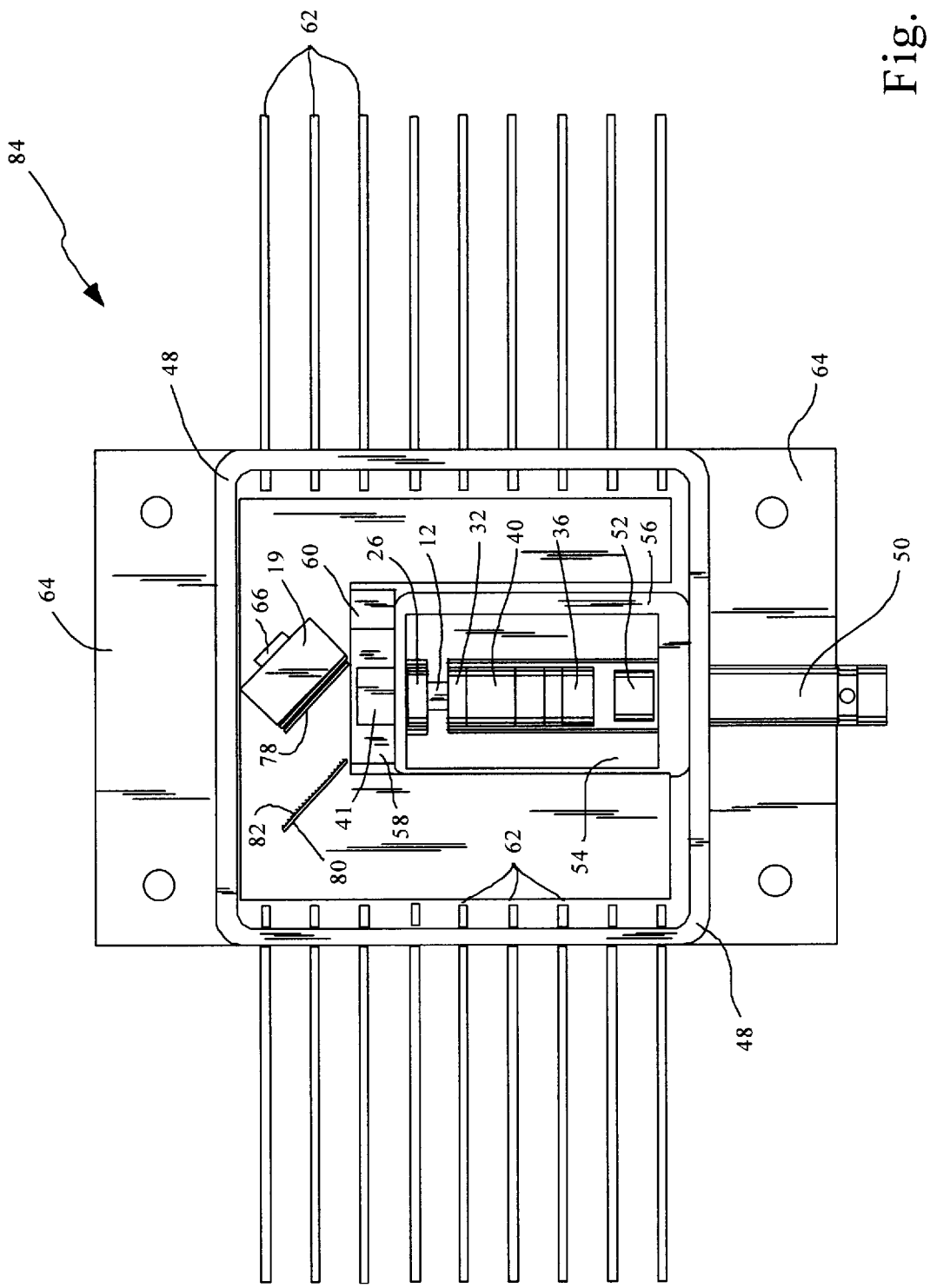
FIG. 7 is a top plan view of the tunable external cavity laser apparatus of FIG. 6 shown mounted on a sled in a hermetically sealed container.

The laser apparatus 78 may also be embodied in a laser transmitter device 84 as shown in FIG. 7 wherein the apparatus 78 is enclosed within a hermetically sealable container or enclosure 48. Like parts in FIG. 7 are denoted by like reference numbers. As in the apparatus 46 described above, gain medium 12 and isolator 40 are mounted on thermally conductive platform 54 for selective thermal control by thermoelectric controller 56, and etalon 41 is mounted on thermally conductive platform 58 for independent thermal control by thermoelectric controller 60. Output from laser apparatus 78 is directed into a fiber (not shown) mounted in ferrule 52 as also described above. The overall package size of the laser device 84 and container 48 of FIG. 7 may be slightly larger than that of the apparatus 46 in FIG. 2, in order to accommodate the longer external cavity of the laser apparatus 78.

Figure 8:
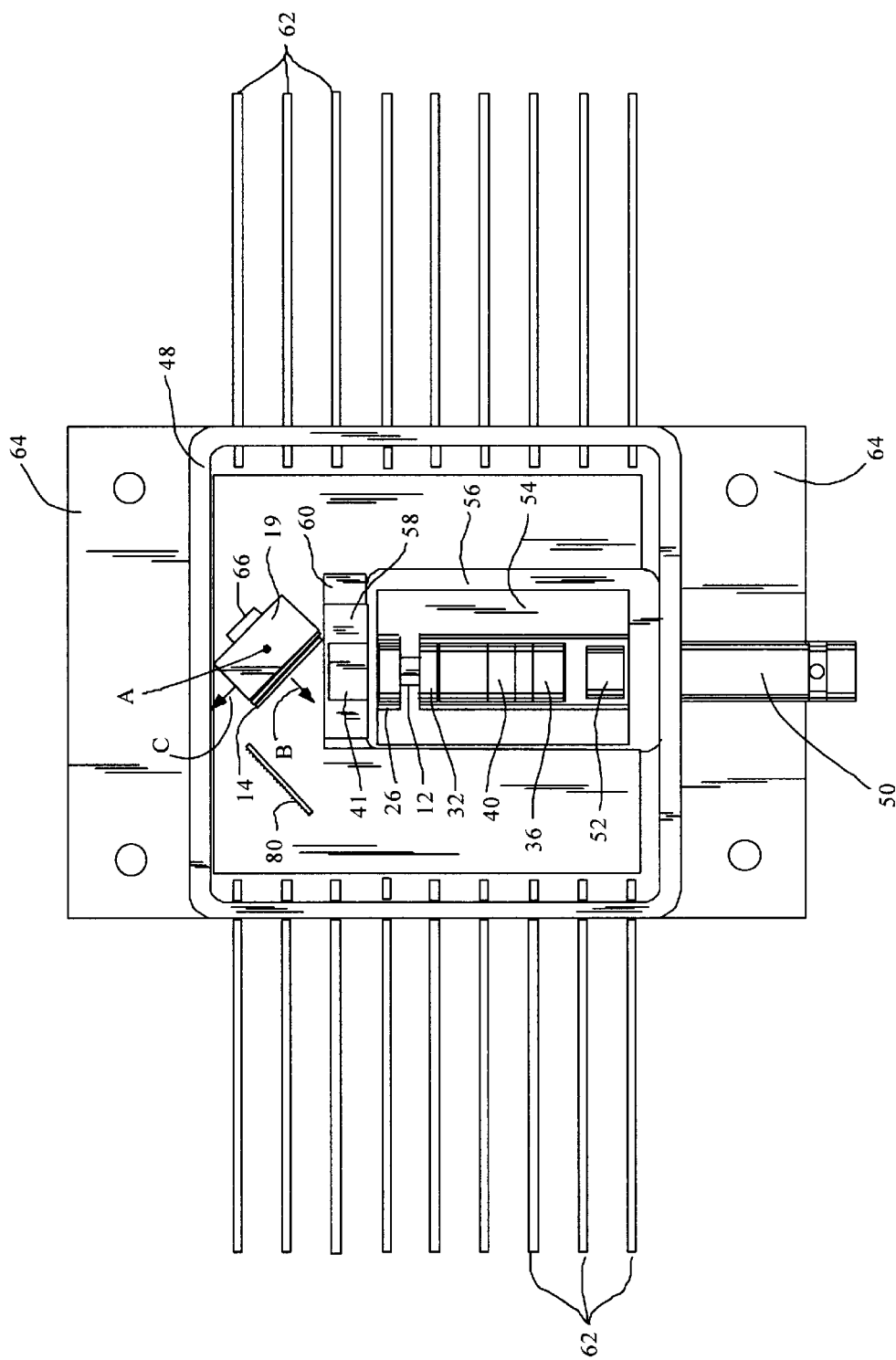
FIG. 8 is a top plan view of the tunable external cavity laser apparatus of FIG. 7 shown with the grating oriented such that the grating face is substantially perpendicular to the face of the movable mirror.

Referring now to FIG. 8, there is shown a laser apparatus 84, with like numbers denoting like part. In the apparatus 84, the stationary reflective grating 80 is changed in orientation with respect to movable mirror 78. In the apparatus 76 and 78 discussed above, grating 80 is shown in an orientation such that grating surface 82 is substantially parallel to movable mirror 78. In the apparatus 84 of FIG. 8, grating 80 is positioned such that grating face 82 is substantially perpendicular or normal to mirror 78. The apparatus 84 in other respects is substantially identical to the apparatus 84 described above.

Figure 9:
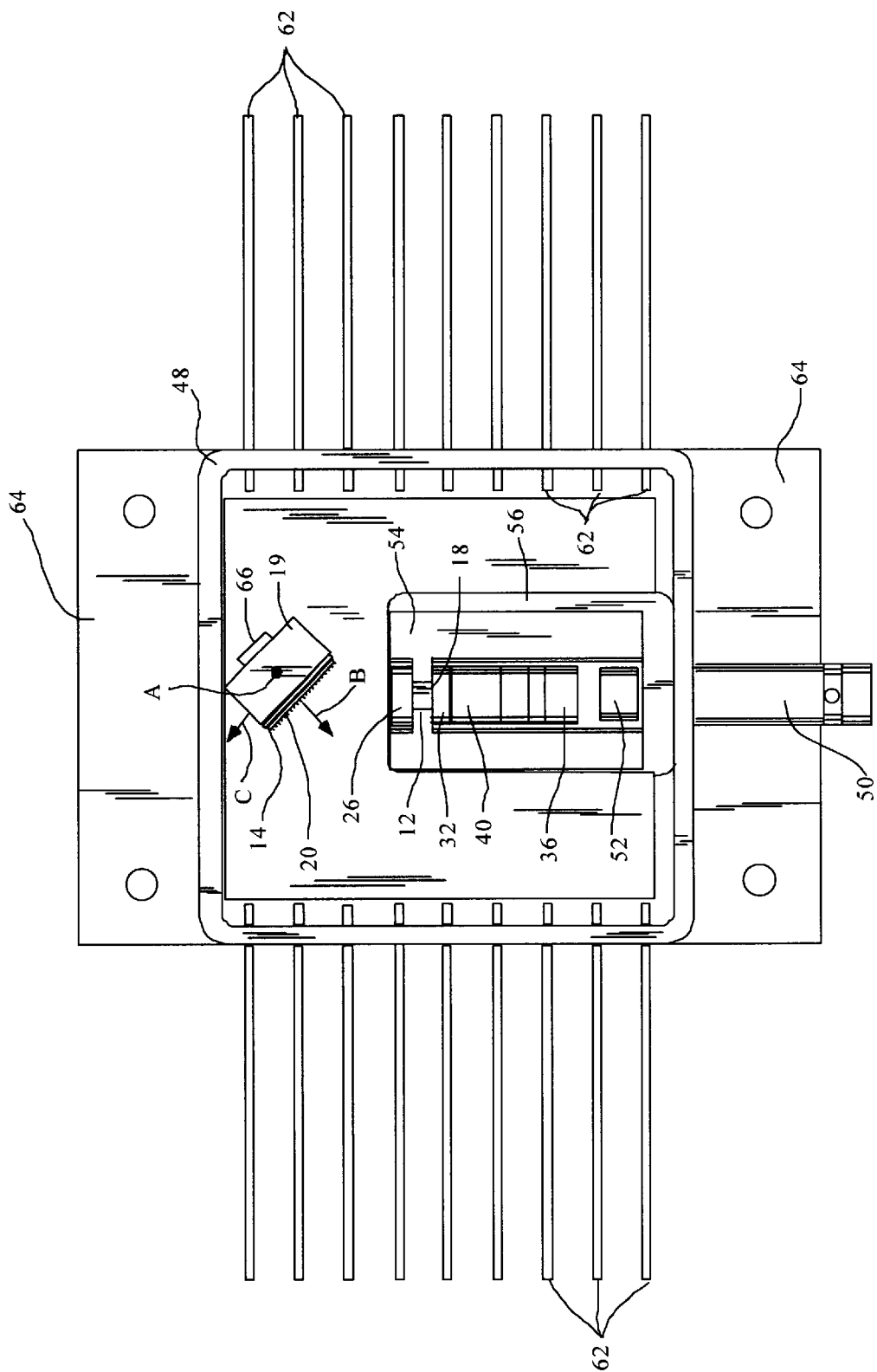
FIG. 9 is a top plan view of an external cavity laser apparatus in accordance with the invention with a shortened external cavity length and without an intracavity mode suppression filter.

Referring next to FIG. 9, yet another embodiment of a laser apparatus 86, wherein like numbers are used to denote like parts. In the apparatus 86, the etalon filter 41 is omitted, and grating 14 is positioned proximate to collimator 26, to shorten the length of the external laser cavity defined by grating surface 20 and rear facet 18 of gain medium. Shortening of the laser cavity in this manner increases the spacing of the external cavity modes with respect to each other. Thus, the external cavity modes may be configured such that no external cavity modes are proximate to or otherwise close in wavelength to the selectable wavelengths of the laser apparatus 86.

The short external laser cavity length of the apparatus 86 eliminates the need for an additional wavelength suppression element or filter, such as the etalon 41 shown in FIG. 1 through FIG. 8 and discussed above, because unwanted lasing associated with external cavity modes will not occur due to the relatively wide spacing of the cavity modes. In some embodiments, the external laser cavity length can be adjusted such that the external cavity modes themselves define the wavelengths that are selected by positioning of grating 14. In other words, the external cavity serves as a wavelength locker or grid generator, with the cavity mode peaks corresponding to a desired wavelength grid. Omission of the etalon filter also allows a smaller overall package for the apparatus 86, and reduces the overall cost of the apparatus.

In other embodiments of the invention, a tunable wavelength selection other than a grating may be used. Thus, MEMS actuator 19 may be configured to position an etalon, interference filter, prism or other element that can provide wavelength selection according to MEMS actuated positioning. Various types of tunable wavelength selection elements that may be used with the invention in place of grating 14 are disclosed in U.S. patent application Ser. No. 09/814,464 filed on Mar. 21, 2001, the disclosure of which is incorporated herein by reference.

While the present invention has been described with reference to the specific embodiments thereof, it should be understood by those skilled in the art that various changes may be made and equivalents may be substituted without departing from the true spirit and scope of the invention. In addition, many modifications may be made to adapt a particular situation, material, composition of matter, process, process step or steps, to the objective, spirit and scope of the present invention. All such modifications are intended to be within the scope of the claims appended hereto.

What is claimed is:

1. An external cavity laser apparatus, comprising:
    (a) a gain medium to emit a light beam; and
    (b) a tunable element positioned to receive said light beam and configured to feed back light of a selected wavelength to said gain medium;
    (c) said tunable element adjustable according to a first degree of freedom of movement to provide selection of a wavelength of said light fed back to said gain medium;
    (d) said tunable element adjustable according to a second degree of freedom of movement to provide control of a phase of said light fed back to said gain medium;
    (e) said tunable element configured such that adjustment of said tunable element for control of said phase is orthogonal with respect to adjustment of said tunable element for said selection of said wavelength.

2. The apparatus of claim 1, further comprising a microelectromechanical system actuator element operatively coupled to said tunable element, said microelectromechanical system actuator element configured to actuate said tunable element according to said first and second degrees of freedom of movement.

3. The apparatus of claim 2, wherein said microelectromechanical system actuator is configured to actuate said tunable wavelength selection element according to a third degree of freedom of movement to provide adjustment of power of said light fed back to said gain medium.

4. The apparatus of claim 1, wherein said tunable wavelength selection element comprises a movable grating, said grating and a facet of said gain medium defining an external laser cavity.

5. The apparatus of claim 4, wherein said microelectromechanical system actuator element is configured to rotate said grating about a first axis to control wavelength of said light fed back to said gain medium by said grating.

6. The apparatus of claim 5, wherein said microelectromechanical system actuator element is configured to translate said grating along a second axis to control length of said external cavity.

7. The apparatus of claim 5, wherein said microelectromechanical system actuator element is configured to rotate said grating about a third axis to control attenuation of said light fed back to said gain medium by said grating.

8. The apparatus of claim 7, wherein said first axis is parallel to a reflective face of said grating.

9. The apparatus of claim 8, wherein said second axis is perpendicular to said reflective face of said grating.

10. The apparatus of claim 9, wherein said third axis is perpendicular to said first axis and said second axis.

11. The apparatus of claim 1, wherein said tunable wavelength selection element comprises a movable mirror and a stationary reflective grating.

12. The apparatus of claim 11, wherein said microelectromechanical system actuator element is configured to rotate said mirror about a first axis to control wavelength of said light fed back to said gain medium.

13. The apparatus of claim 12, wherein said microelectromechanical system actuator element is configured to translate said mirror along a second axis to control external cavity length.

14. The apparatus of claim 12, wherein said microelectromechanical system actuator element is configured to rotate said mirror about a third axis to control attenuation of said light fed back to said gain medium.

15. The apparatus of claim 1, further comprising a filter element positioned to receive said light beam, said filter element configured to suppress lasing at wavelengths other than said selected wavelength.

16. The apparatus of claim 1, wherein a reflective face of said tunable wavelength selection element and a facet of said grating define an external laser cavity.

17. The apparatus of claim 16, wherein said external laser cavity is dimensioned to define a plurality of external cavity modes, said external cavity modes corresponding to selectable wavelengths.

18. An external cavity laser apparatus, comprising:
    (a) a gain medium having first and second facets to emit a light beam from said first facet;
    (b) a tunable wavelength selection element, said tunable wavelength selection element comprising a grating, said tunable wavelength selection element positioned to receive said light beam and configured to feed back light to said gain medium, said grating and said second facet of said gain medium defining an external laser cavity; and
    (c) a microelectromechanical system actuator element operatively coupled to said tunable wavelength selection element;
    (d) said microelectromechanical system actuator element configured to actuate said tunable wavelength selection element according to a first degree of freedom of movement to provide selection of a wavelength of said light fed back to said gain medium;
    (e) said microelectromechanical system actuator configured to actuate said tunable wavelength selection element according to a second degree of freedom of movement to control a length of said external laser cavity;
    said tunable wavelength selection element configured such that actuation of said tunable wavelength selection element to control the length of said external laser cavity is orthogonal with respect to actuation of said tunable wavelength selection element for selection of said wavelength.

19. The apparatus of claim 18, wherein said microelectromechanical system actuator is configured to actuate said tunable wavelength selection element according to a third degree of freedom of movement to control power of said light fed back to said gain medium.

20. The apparatus of claim 19, wherein:
    (a) said microelectromechanical system actuator is operatively coupled to said grating;
    (b) said microelectromechanical system actuator element configured to rotate said grating about a first axis to control said wavelength of said light fed back to said gain medium;

(c) said microelectromechanical system actuator element configured to translate said grating along a second axis to control said length of said external laser cavity; and (d) said microelectromechanical system actuator element configured to rotate said grating about a third axis to control said power of said light fed back to said gain medium.

21. The apparatus of claim 20, wherein said first axis is parallel to a reflective face of said grating.

22. The apparatus of claim 21, wherein said second axis is perpendicular to said reflective face of said grating.

23. The apparatus of claim 19, wherein:

(a) said tunable wavelength selection element further comprises a mirror, said mirror operatively coupled to said microelectromechanical system actuator;

(b) said microelectromechanical system actuator element configured to rotate said mirror about a first axis to control said wavelength of said light fed back to said gain medium;

(c) said microelectromechanical system actuator element configured to translate said mirror along a second axis to control said length of said external laser cavity; and (d) said microelectromechanical system actuator element configured to rotate said mirror about a third axis to control said power of said light fed back to said gain medium.

24. The apparatus of claim 23, wherein said first axis is parallel to a reflective face of said grating.

25. The apparatus of claim 24, wherein said second axis is perpendicular to said reflective face of said grating.

26. The apparatus of claim 18, further comprising a filter element positioned in said light beam, said filter element configured to suppress lasing at wavelengths other than said selected wavelength.

27. The apparatus of claim 18, wherein said external laser cavity is dimensioned to define a plurality of external cavity modes, said external cavity modes corresponding to selectable wavelengths.

28. The apparatus of claim 18, wherein said external laser cavity is dimensioned to suppress lasing associated with external cavity modes.

29. A method for laser operation, comprising:

(a) emitting a light beam from a gain medium;

(b) positioning a tunable element in said light beam;

(c) feeding back light to said gain medium by said tunable element;

(d) selecting a wavelength of said light fed back to said gain medium by positionally adjusting said tunable element with respect to a first degree of freedom of movement; and (e) controlling a phase of said light fed back to said gain medium by positionally adjusting said tunable element with respect to a second degree of freedom of movement;

(f) said positionally adjusting of said tunable element for controlling said phase carried out orthogonally with respect to said positionally adjusting said tunable element for selecting said wavelength.

30. The method of claim 29, further comprising coupling said tunable wavelength selection element to a microelectromechanical actuator.

31. The method of claim 30, further comprising adjusting power of said light fed back to said gain medium by positionally adjusting said tunable wavelength selection element, with said microelectromechanical actuator, with respect to a third degree of freedom of movement.

32. The method of claim 31, wherein said positioning a tunable wavelength selection element in said light beam comprises positioning a movable grating in said light beam, said grating and a reflective facet of said gain medium defining an external laser cavity.

33. The method of claim 32, wherein said selecting said wavelength of said light fed back to said gain medium comprises rotatably adjusting said grating, by said microelectromechanical actuator, about a first axis.

34. The method of claim 33, wherein said adjusting said phase of said light fed back to said gain medium comprises adjusting length of said external cavity by translatably adjusting said grating, by said microelectromechanical actuator, along a second axis.

35. The method of claim 34, wherein said adjusting said power of said light fed back to said gain medium comprises rotatably adjusting said grating, by said microelectromechanical actuator, about a third axis.

36. The method of claim 31, wherein said positioning a tunable wavelength selection element in said light beam comprises positioning a movable mirror in said light beam, and positioning a stationary grating in said light beam after said movable mirror, said grating and a reflective facet of said gain medium defining an external laser cavity.

37. The method of claim 36, wherein said selecting said wavelength of said light fed back to said gain medium comprises rotatably adjusting said mirror, by said microelectromechanical actuator, about a first axis.

38. The method of claim 37, wherein said adjusting said phase of said light fed back to said gain medium comprises adjusting length of said external cavity by translatably adjusting said mirror, by said microelectromechanical actuator, along a second axis.

39. The method of claim 38, wherein said adjusting said power of said light fed back to said gain medium comprises rotatably adjusting said mirror, by said microelectromechanical actuator, about a third axis.

40. The method of claim 29, further comprising positioning a filter element in said light beam, said filter element configured to suppress lasing at wavelengths other than a selected wavelength.

41. A laser apparatus, comprising:

(a) gain means for emitting a light beam;

(b) tunable means for wavelength selection positioned to receive said light beam and configured to feed back light of a selected wavelength to said gain medium; and (c) actuation means for positionally adjusting said tunable means with respect to a first degree of freedom of movement to provide selection of the wavelength of said light fed back to said gain medium, and for positionally adjusting said tunable means with respect to a second degree of freedom of movement to provide control of a phase of said light fed back to said gain medium;

(d) said tunable means configured such that said positional adjustment of said tunable means for control of said phase is orthogonal with respect to said adjustment of said tunable means for selection of said wavelength.

42. A laser apparatus, comprising:

a gain medium to emit an light beam; and a tunable element having a reflective face and positioned to receive the light beam and to feed back light having a selected wavelength to the gain medium, the tunable element adjustable according to a first degree of freedom of movement to provide selection of the wavelength of the light fed back to the gain medium, the tunable element adjustable according to a second degree of freedom of movement along an axis substantially perpendicular to the reflective face to provide control of a phase of the light fed back to the gain medium.

43. The laser apparatus of claim 42 wherein the tunable element is configured such that the first degree of freedom of movement is orthogonal to the second degree of freedom of movement.

44. The laser apparatus of claim 42, further comprising a microelectromechanical system actuator element operatively coupled to the tunable element and configured to actuate the tunable element according to the first and second degrees of freedom of movement.

45. The laser apparatus of claim 42 wherein the tunable element is further adjustable according to a third degree of freedom of movement to provide adjustment of power of the light fed back to the gain medium.

46. The laser apparatus of claim 42 wherein the reflective face comprises a grating.

47. The laser apparatus of claim 46 wherein the gain medium further comprises a partially reflective facet and wherein the partially reflective facet and the grating define extremities of an external cavity.

48. A communication system, comprising:
   a laser device comprising:
      a gain medium to emit a light beam to carry a signal modulated thereon; and
      a tunable element having a reflective face and positioned to receive the light beam and to feed back light having a selected wavelength to the gain medium, the tunable element adjustable according to a first degree of freedom of movement to provide selection of the wavelength of the light fed back to the gain medium, the tunable element adjustable according to a second degree of of freedom of movement along an axis substantially perpendicular to the reflective face to provide control of a phase of the light fed back to the gain medium; and
   an optic fiber coupled to receive the light beam from the gain medium and to transmit the light beam over a wavelength division multiplexing system.

49. The communication system of claim 48 wherein the laser device further comprising a microelectromechanical system actuator element operatively coupled to the tunable element and configured to actuate the tunable element according to the first and second degrees of freedom of movement.

50. The communication system of claim 48 wherein the tunable element is further adjustable according to a third degree of freedom of movement to provide adjustment of power of the light fed back to the gain medium.

51. The communication system of claim 48 wherein the reflective face comprises a grating.

* * * * *